United States Patent
Goodberlet (12)

(10) Patent No.: US 6,243,348 B1
(45) Date of Patent: Jun. 5, 2001

(54) VERY-HIGH-DENSITY MEMORY DEVICE UTILIZING A SCINTILLATING DATA-STORAGE MEDIUM

(75) Inventor: James G. Goodberlet, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/326,278

(22) Filed: Jun. 4, 1999

Related U.S. Application Data

(60) Provisional application No. 60/088,318, filed on Jun. 5, 1998.

(51) Int. Cl.[7] .................................................. G11B 7/00
(52) U.S. Cl. ..................... 369/101; 369/275.2; 369/288; 428/690
(58) Field of Search .............................. 369/275.2, 275.3, 369/101, 44.37, 126, 112, 44.28, 288, 44.11, 121, 100; 428/457, 690, 917; 250/361 R, 491.1; 359/241, 321

(56) References Cited

U.S. PATENT DOCUMENTS

| | | | |
|---|---|---|---|
| 5,007,037 | * 4/1991 | Lindmayer | 369/100 |
| 5,122,663 | 6/1992 | Chang et al. | 250/310 |
| 5,402,410 | 3/1995 | Yoshimura et al. | 369/275.1 |
| 5,446,687 | 8/1995 | Hurt et al. | 365/121 |
| 5,448,514 | 9/1995 | Cho et al. | 365/151 |
| 5,557,596 | 9/1996 | Gibson et al. | 369/101 |
| 5,602,819 | 2/1997 | Inagaki et al. | 369/121 |

FOREIGN PATENT DOCUMENTS

| | | |
|---|---|---|
| 0460347 | 12/1991 | (EP) . |
| 0734017 | 9/1996 | (EP) . |
| WO 98/54746 | 12/1998 | (WO) . |

OTHER PUBLICATIONS

Goodberlet, James G., "A Very–High–Density Scintillation–Data–Storage Device", *Microelectric Engineering*, vol. 46, 1999, pp. 145–148.

Nagaaki, Etsuno, "Electron Beam Recording and Reproducing Device", *Patent Abstracts of Japan*, Japanese Pat. Appln. No. 58095254, Filed May 30, 1983.

* cited by examiner

*Primary Examiner*—Tan Dinh
*Assistant Examiner*—Kim-Kwok Chu
(74) *Attorney, Agent, or Firm*—Samuels, Gauthier & Stevens, LLP

(57) ABSTRACT

A very-high-density memory device which utilizes a scintillating medium for data storage. In one mode, the device operates as a read-only-memory (ROM) unit. In another mode, the device functions as a one-time-write (OTW) and then read-only-memory unit. In an exemplary embodiment, information is read at high data rates from a rotating data-storage disk or cylinder with an electron beam and sensitive photodetector. Two methods of following the data tracks on the storage medium are provided. Masks are provided for use in patterning the data or data tracks. These masks may also be used to pattern very-high-density media for other applications such as magnetic memory and optical near-field memory. A method of patterning radially-periodic structures using interferometric lithography is also provided.

12 Claims, 10 Drawing Sheets

VERY-HIGH-DENSITY MEMORY DEVICE UTILIZING A SCINTILLATING DATA-STORAGE MEDIUM

PRIORITY INFORMATION

This application claims priority from provisional application Ser. No. 60/088,318 filed Jun. 5, 1998.

BACKGROUND OF THE INVENTION

The invention relates to the field of very-high-density memory device that utilizes a scintillating medium for data storage.

With the development of the internet, the desire for video-on-demand services, and increases in high-volume-data applications, the demand for high-density memory will continue to grow. Currently, there are two prevalent types of high-density data storage media. One is based on magnetic storage and the other is termed optical-data storage. For commercial magnetic-storage media, data-storage densities of about 2 billion bits per square centimeter (2 Gb/cm$^2$) have been achieved. Data storage densities of about 100 Mb/cm$^2$ have been achieved for commercial optical data storage. It is desirable to obtain even higher memory-storage densities.

Both magnetic-storage and optical-storage techniques incur significant technical difficulties as the data-storage density is increased. For magnetic storage, increasing densities imply a smaller size for the individual magnetic bit, and this reduction in size leads to a decreasing magnetic field. The data-reading head must then be moved closer to the disk to detect the bit. Presently, the magnetic reading head rides on a cushion of air and floats much less than 1 micron above the disk surface. As the bits are placed closer to each other, they are likely to interact and spontaneously flip the magnetic field from bit to bit, ruining the stored data.

Optical-data storage suffers from a similar problem of data readability. For CD-ROM, the bit size cannot be made significantly smaller than the probing size of the focused optical field at the substrate. This probe size is on the order of 1 micron for laser diodes and inexpensive optical lenses. Novel near-field optical reading schemes have been proposed (see Martin et al., Appl. Phys. Lett., Vol. 7 (1997)), but the reading head must be brought to within 0.01 microns from the surface to detect the bit. Any particles on the storage-medium's surface could irreversibly damage the reading head for both optical-and magnetic-storage schemes. It is desirable to locate the data-reading head several millimeters from the storage-medium's surface.

A related problem for magnetic- and optical-data-storage devices pertains to the quality of the signal derived from the stored data, i.e., how well can a "low" data bit be distinguished from a "high" data bit. As the bit size decreases, the signal level from the data bit decreases while system noise remains unchanged. The resulting noisy signals for magnetic- and optical-data-storage devices are likely to cause data read-out errors.

Another problem that will be incurred by very-high-density magnetic and optical-data-storage devices is an inability to follow the data tracks precisely on the data-storage medium. As the data tracks are packed closer together, the reading head must be able to navigate directly along the data track, which may be deviated. It is likely that the massive reading heads for magnetic- and optical-data-storage devices will "jump" data tracks, since they cannot be deflected easily at high speeds to follow the data path. It is desirable to provide a means for precisely following the data tracks at high speeds or read-out rates.

SUMMARY OF THE INVENTION

The invention provides a system for storing data on a scintillating medium and reading the data with an electron beam, which impinges on the scintillating medium through vias that define the stored data, and a sensitive photodetector, which is located near the scintillating medium. The system is also capable of following the data tracks in the scintillating medium where the medium may be in the shape of a rectangle, a circular disk, or a cylinder. The system also is capable of patterning data tracks or stored data in the storage medium.

In one embodiment, a single electron source is used to probe a spinning, scintillating data-storage disk, and a single photodetector is used to detect the scintillation signal, corresponding to the stored data in the storage disk. In another embodiment, multiple electron beams and photodetectors are used to read the data from the scintillating data-storage medium in parallel.

In an alternative embodiment, an electron beam is used to write the data to the scintillating medium by locally damaging the scintillating medium. In another embodiment, the data may be patterned onto the scintillating medium using deep-ultraviolet contact photolithography and embedded attenuating-phase-shift masks. In yet another embodiment, the data tracks may be patterned onto the scintillating medium using a novel mode of interferometric lithography. The technique for patterning the data or data tracks on the scintillating medium may be used for patterning very-high-density magnetic-data-storage and optical-data-storage media.

The invention provides a system for obtaining data-storage densities greater than 20 billion bits per square centimeter (20 Gb/cm02). There is a fundamental amplification of the signal in the scintillating data-storage medium, and the contrast (on-to-off ratio) of the data signal can be infinite in principal. Additionally, the signal level remains constant as the bit size decreases for the very-high-density memory device of the invention.

DETAILED DESCRIPTION OF THE INVENTION

Figure 1:
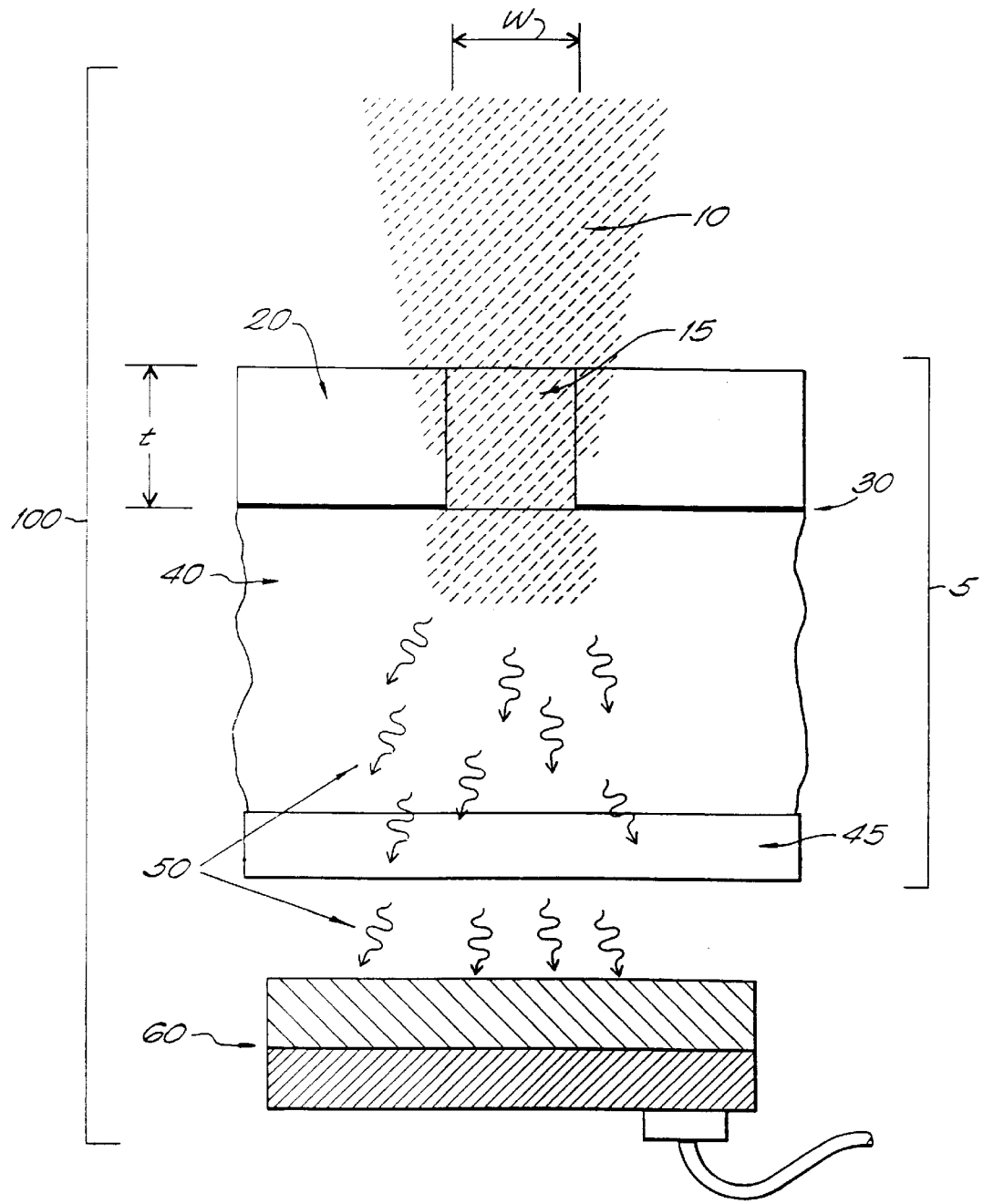
FIG. 1 is a side view of a functional block diagram of an exemplary embodiment of a very-high-density memory device in accordance with the invention.

FIG. 1 is a functional block diagram of an exemplary embodiment of a very-high-density memory device 100 in accordance with the invention. In this embodiment of the invention, a focused beam of electrons 10 impinges on a scintillating data-storage medium 5, and passes through a via 15 creating photons 50 in a scintillating material 40. The photons are then detected with a sensitive photodetector 60. When the electron beam is incident on a top blocking layer 20, no electrons reach the scintillating material 40, and no signal is detected.

A scintillator is any material or chemical compound that emits photons when struck by high-energy electrons, or other high-energy particles such as ions or photons. Scintillating material refers to any material that acts as a scintillator. A scintillating data-storage medium is a data-storage medium where the data is encoded in scintillating material and which may be comprised of additional non-scintillating material.

Data is then stored in binary form, where a logical-1 bit corresponds to a detected signal and a logical-0 bit corresponds to no signal, or vise versa. The stored data, or information, corresponds to the patterned holes over the surface of the scintillating material. Data is read from the scintillating data-storage medium as the medium moves relative to the electron beam. The electron-beam source and scintillating medium are preferably contained in a vacuum environment so that the electrons may travel to the surface of the scintillating medium. The photodetector may be inside or outside the vacuum environment, In this embodiment, the electron-beam source may be located more than 1 mm from the surface of the scintillating data-storage medium. In an alternative embodiment, a focused beam of energetic ions or x-rays may be used too excited the scintillating material rather than electrons.

The scintillating data-storage medium 5 includes the scintillating material 40 and the top blocking layer, 20. The scintillating material 40 may be an organic scintillator, such as BC-400 available from Bicron Industries, or an inorganic scintillator such as silver-doped zinc sulfide ZnS(Ag), also commercially available. A scintillator is any material or chemical compound that emits photons when struck by high-energy electrons, or other high-energy particles such as ions or photons. Any efficient scintillator, i.e., one that emits many photons per incident electron, would be suitable for the data-storage medium.

Two additional layers are shown as part of the medium, however, these layers are not strictly required. A thin interlayer 30 may be used to prevent intermixing between the top layer 20 and the scintillator 40, which may occur during fabrication of the medium. Additionally, the storage medium may be fabricated on a transparent material 45 such as glass. This glass layer 45 can be used to increase the rigidity of the scintillating data-storage medium 5.

The top blocking layer 20 would be preferably a resist material so that the holes or vias 15 can be patterned by lithographic methods, known to those skilled in the art of lithography. The thickness, t, of this layer must be large enough to stop the incident electrons in the focused beam 10. If the incident electrons have an energy $E_0$ in kiloelectron-volts (keV), then the thickness, t, of the top layer is given by $$t > 0.0276 A E_0^{1.67}/(Z^{0.889}\rho)$$

where A is atomic weight, Z is atomic number and $\rho$ is the density of the material. See J. Orloff, *Handbook of Charged Particle Optics,* CRC Press, N. Y., p. 377 (1997), incorporated herein by reference.

The diameter of the hole, or via 15, in this layer is equal preferably to the minimum diameter of the focused electron beam. This diameter could be as small as 5 nm (1 nm=$10^{-9}$ m) for a state-of-the-art focused electron-beam system. Assuming an electron beam focal spot size of 50 nm, a resist-layer hole size of 30 nm and a data-track separation of 80 nm, the data storage density would be 21 Gb/cm$^2$. A 100 $\mu$m-wide data sector on a 3 inch diameter disk or cylinder would store 6 Mb of data. A data sector is a region or section of the data-storage medium that contains a portion of the total stored data. A 2.5 inch diameter cylinder which is 5 inches tall (the size of a soda can) would store about 4.5 Tb (1Tb=$10^{12}$ bits).

The photon signal from the scintillating data-storage medium is detected with the sensitive photodetector 60 located near the scintillating medium. If the scintillating material, 40 is highly efficient, this detector might be a simple photodiode. If the photon signal is low, then this detector might be an avalanche photodiode, a photomultiplier tube, or a photosensitive micro-channel plate. Use of these detectors is known to those skilled in the art of low-level optical detection.

The data-read rate is limited primarily by the scintillation-decay time of the scintillating material 40. The decay time is defined herein as the time interval for the scintillation signal to fall to 0.37 of the peak signal, after the electron beam has been blocked. To assure a good signal-to-noise ratio, the time between two digital-high bits separated by a digital-low bit, should be one or two scintillation-decay time intervals. The scintillator ZnS(Ag) has a decay time of 5 ns, which would yield a data-read rate of about 100 Mb/s for the device 100 embodied in FIG. 1. The read-rate should not be limited by the photodetector, since microchannel-plate detectors have response times below 1 ns.

Figure 2:
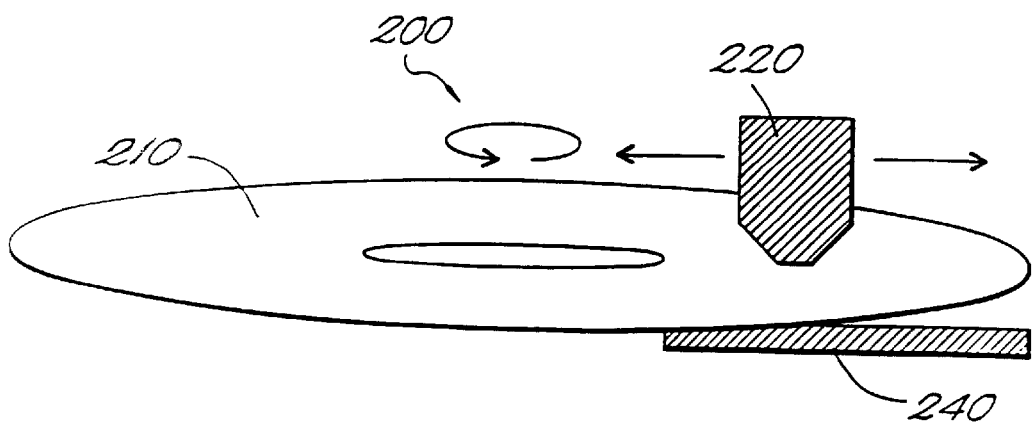
FIG. 2 is a perspective view of a functional block diagram of an alternative exemplary embodiment of a very-high-density data-storage device in accordance with the invention.

FIG. 2 is a perspective view of a functional block diagram of a very-high-data-storage device 200 in accordance with the invention. In this embodiment, the scintillating data-storage medium is in the shape of a thin disk 210, which spins. The electron-beam source 220, which produces a focused beam of electrons, is shown positioned above the disk, and the photodetector 240 is shown positioned below the disk. The electron-beam source might be a field-emission tip, or a compact, integrated electron-beam imaging system, as described in U.S. Pat. No. 5,122,663 issued to Chang et al., incorporated herein by reference. Different areas of the disk can be read by moving the e-beam source radially, as indicated by the arrows in FIG. 2. The disk and electron-beam source are preferably contained in a vacuum assembly so that the electrons will travel to the disk surface. The vacuum assembly can be fabricated by those skilled in the art of vacuum electronics.

Figure 3:
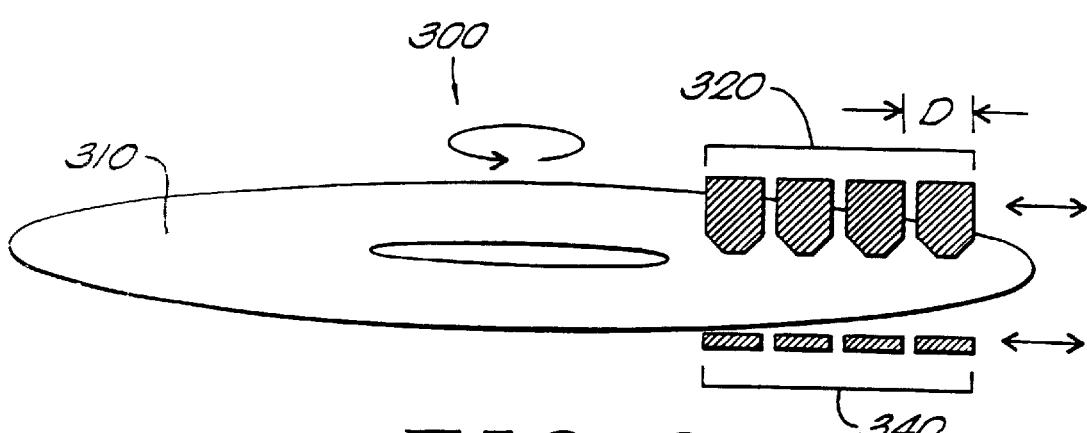
FIG. 3 is a perspective view of a functional block diagram of another alternative exemplary embodiment of a very-high-density data-storage device in accordance with the invention.

FIG. 3 is a perspective view of a functional block diagram of an alternative embodiment of a very-high-density data-storage device 300 in accordance with the invention. For the embodiment shown in FIG. 3, multiple electron-beam sources 320 and multiple photodetectors 340 are used to access the data on a spinning scintillating data-storage disk 310, in parallel, i.e., simultaneously. In this embodiment, the e-beam sources and photodetectors are scanned radially by a distance equivalent to the source separation, D.

Figure 4:
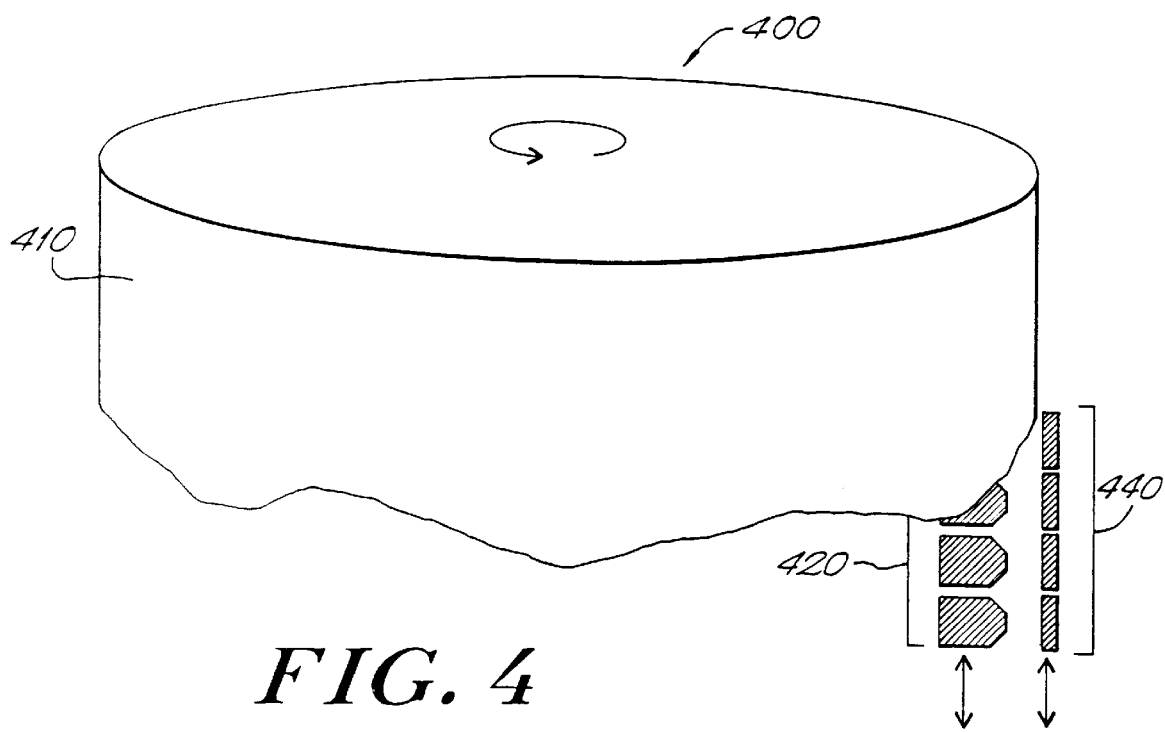
FIG. 4 is a perspective view of a functional block diagram of another alternative exemplary embodiment of a very-high-density data-storage device in accordance with the invention.

FIG. 4 is a perspective view of a functional block diagram of an alternative embodiment of a very-high-density data-storage device 400 in accordance with the invention. A scintillating data-storage medium 410 in the shape of a cylinder is provided. For this embodiment, a single electron-beam source, or multiple e-beam sources 420 can be used to access the data, and a single photodetector, or multiple photodetectors 440 can be used to detect the scintillation signal. The cylinder is preferably rotated while the data is read, and the e-beam source is scanned vertically to access different regions of the cylinder.

Figure 5:
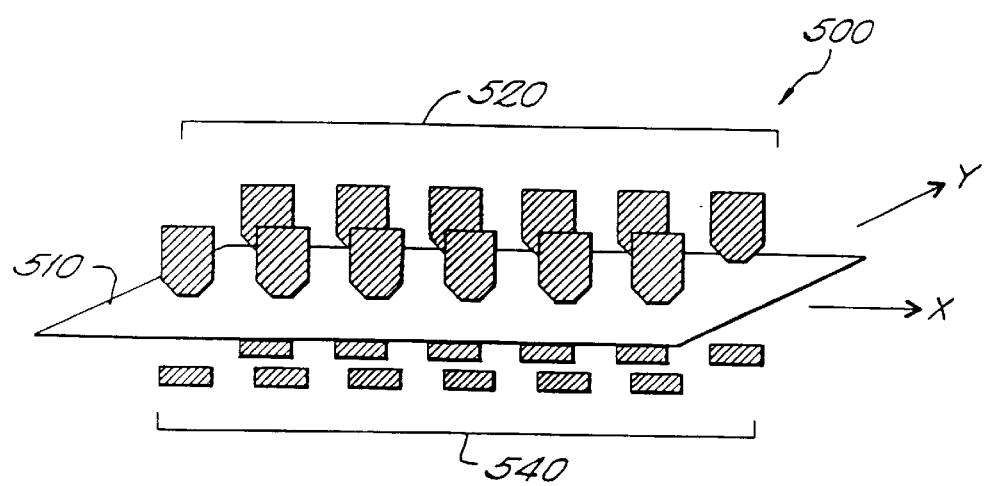
FIG. 5 is a perspective view of a functional block diagram of yet another alternative exemplary embodiment of a very-high-density data-storage device in accordance with the invention.

FIG. 5 is a perspective view of a functional block diagram of another alternative embodiment of a very-high-density data-storage device 500 in accordance with the invention. For the embodiment shown in FIG. 5, the scintillating data-storage medium is in the shape of a rectangular sheet 510. Data is read from the sheet by moving the film 510 or detector array 540 and e-beam source array 520 in X-Y rectangular coordinates as shown.

Figure 6A:
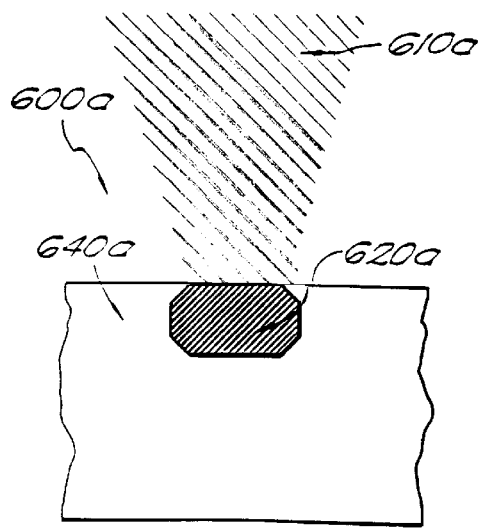
FIGS. 6A and 6B are functional block diagrams of a very-high-density data-storage device can be used in a one-time-write device, and a read-only-memory device, respectively.
Figure 6B:
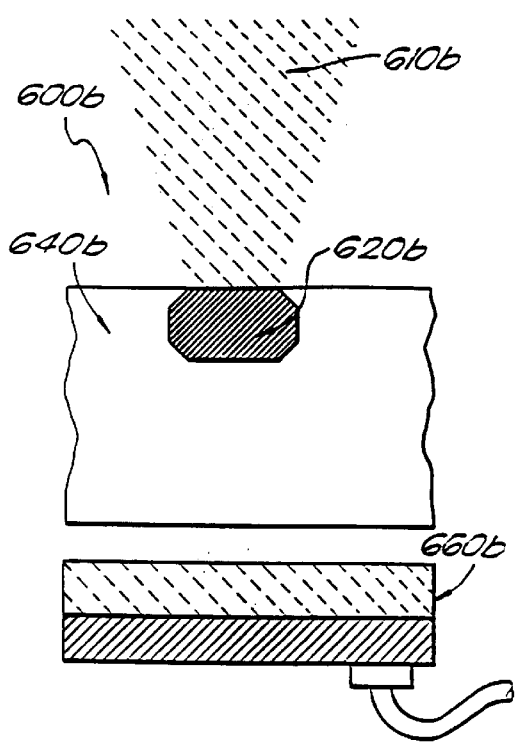

For each of the embodiments illustrated FIGS. 1–5, data has been defined on the storage disk by patterning vias in an an electron-blocking layer 20 of FIG. 1, where the vias correspond to data storage bits. The vias can be arranged in a typical data track, or in a more complicated layout when an electron-beam micro-column is used to read the data. An alternative method for defining the data in the scintillating medium is shown in FIGS. 6A and 6B. In this approach, a local area 620a of a scintillator 640a is damaged by increasing the current in the focused electron beam 610a incident on the scintillating material. Subsequent to damaging, the scintillator 640b no longer efficiently emits photons when excited by a lower-current electron beam 610b at a local area 620b as detected by a photodetector 660b. This effect is well known by those skilled in the art of scintillation detection. For example, see J. B. Birks, *The Theory and Practice of Scintillation Counting,* Macmillan Company, N.Y., p. 205 (1964), incorporated herein by reference. The locally damaged region then corresponds to a logical-0 bit, and undamaged regions correspond to logical-1 bits, or vise versa. In this manner, the very-high-density data-storage device can be used in a one-time-write device 600a of FIG. 6A, and then a read-only-memory device 600b of FIG. 6B.

Two methods for following data tracks will now be described. The data tracks are paths or tracks of sequentially-stored data on the data-storage medium. These techniques may be applied to other types of very-high-density data-storage devices, magnetic or optical, where the data tracks are spaced very closely together.

Figure 7:
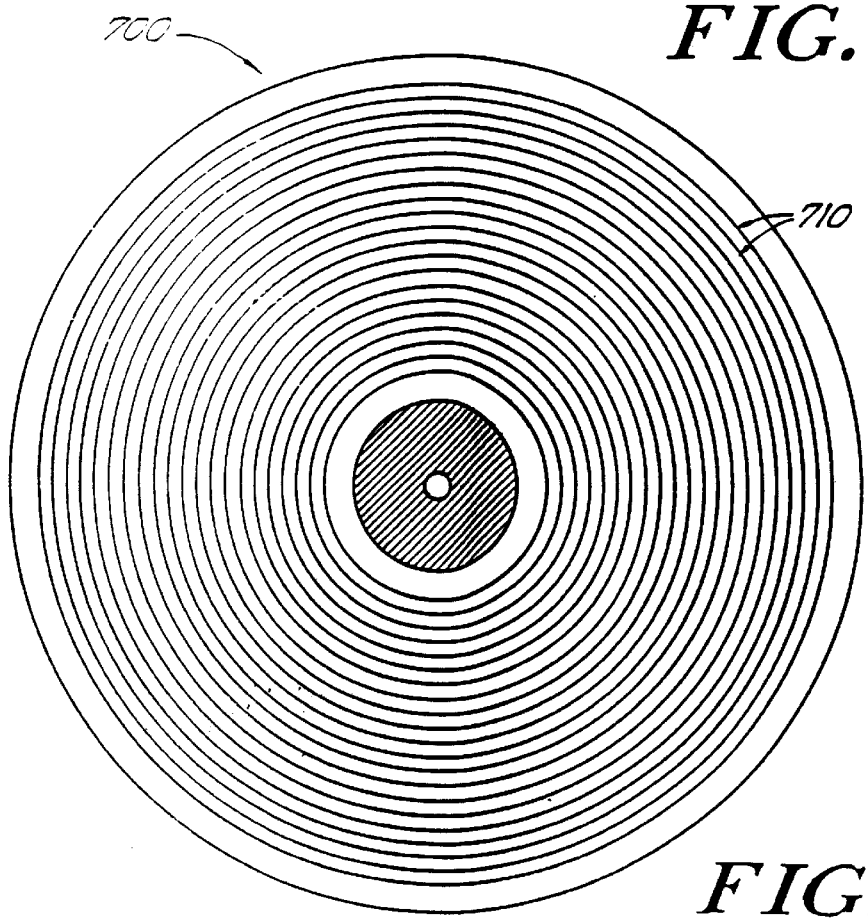
FIG. 7 is a top view of a high-density circular data-storage disk with radially-periodic data tracks.

FIG. 7 is a top view of a high-density data-storage disk 700. Data tracks 710 are provided on the surface of the disk, and are shown as concentric gray circles. The tracks contain the sequentially stored binary data bits (not shown). As the data-track spacing is reduced for higher density data storage, the task of following the data tracks becomes increasingly difficult. For example, the disk may rotate about an axis that is not concentric with the data tracks, or it may wobble as it rotates. Alternatively, the data tracks themselves may not be precisely circular. Accordingly, as the disk rotates the associated data-reading unit (not shown) may jump from track to track causing read-out errors. A data-reading unit refers to the electron source and photodetector in accordance with the invention. Read-out errors occur when a logical-high bit is misread as a logical-low bit, or vise versa, or data is read randomly from the disk due to jumping or skipping of the reading unit.

When an electron-beam micro-column is used to read the data, the electron beam may be deflected laterally to follow the data tracks. However, a signal must be derived from the rotating disk and used to deflect the electron beam. It is imperative that this signal contain information about the direction of the data track. Then, the signal may be used as a feedback signal to lock the electron beam to the data track.

Figure 8:
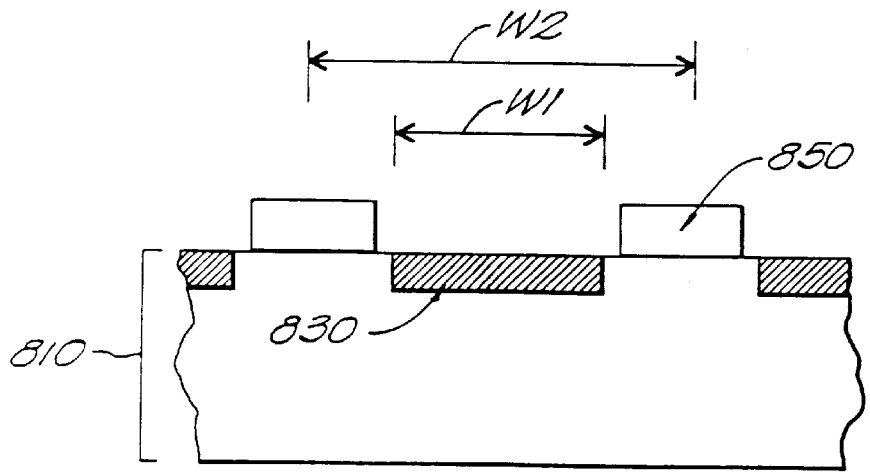
FIG. 8 is a cross-sectional view of a functional block diagram of a data-storage disk.

FIG. 8 shows an exemplary embodiment of one technique to follow the data tracks. FIG. 8 is a cross-sectional view of a functional block diagram of a data-storage disk 810. The view is limited to approximately twice the size of one data track 830. Adjacent to the data track on the surface of the disk is a material 850, which gives a detectable signal, photons or electrons, when struck by an electron beam. This material can also be a scintillator, which emits photons at a different wavelength than those emitted by the scintillating data-storage material.

As the disk 810 rotates (the direction of motion would be into the page as shown in the figure), the electron beam is scanned back-and-forth laterally, at a high speed, a distance W2 which is perpendicular to the direction of disk motion. The rate of lateral scanning should be as high as, or higher than the data-reading rate so that each memory bit is scanned by the electron beam. The data-reading rate is the speed at which data is read from the data-storage medium, i.e., 100 million bits per second.

The scanning-electron beam (not shown) would create a periodic signal as it strikes the material 850 on either side of the data track. The phase of this periodic signal would determine how well the electron beam is centered over the data track. The method of locking the e-beam's position to the center of the data track based upon the phase of a periodic signal would be known to those skilled in the art of electronic phase-locked loops.

In an alternate embodiment, a single set or single ridge of data-tracking material 850 in FIG. 8 can be located at the edge of a data sector. A data sector would consist of N data tracks, where N is a number ranging from 2 to several thousand. In this mode, the memory device would first locate the data-tracking material at the edge of the sector, and then learn the local distortions for the rotating disk. These distortions would be stored as e-beam position corrections. These corrections would then be used to deflect the e-beam laterally as data is read from that sector. Each data sector would have its own data-tracking ridge.

For the laterally scanning electron beam method of following the data tracks, it is only essential that the electron beam be deflected back and forth in one direction. This single-axis deflection differs from the conventional electron-beam microcolumn, which employs beam deflection along X and Y-axes. Thus, the microcolumn design is simplified for the very-high-density data-storage device of the invention. An electron-beam microcolumn or microcolumn is a small fabricated electron optical source which produces a focused electron beam.

Figure 9:
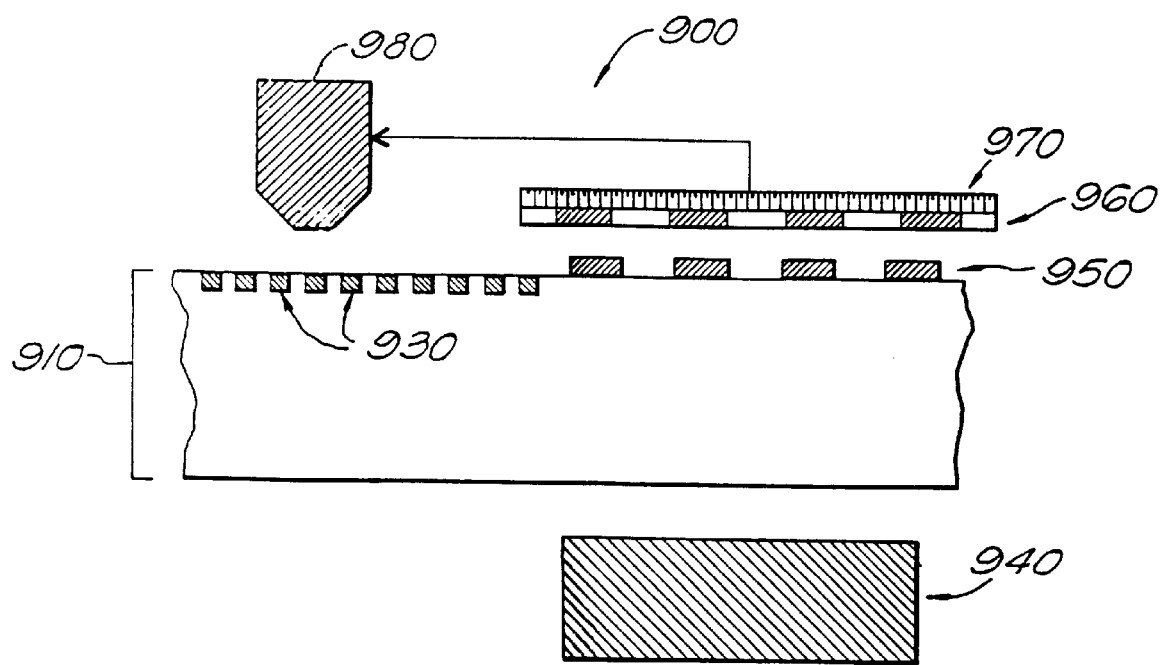
FIG. 9 is a cross-sectional view of a functional block diagram of an exemplary embodiment of a very-high-density data-storage system in accordance with the invention.

Another method of following the data tracks, depicted in FIG. 9, makes use of a moire-detection algorithm. FIG. 9 is a cross-sectional view of a functional block diagram of an embodiment of a very-high-density data-storage system 900 in accordance with the invention. For this method, a grating 950 with period P1 is patterned on a data-storage medium 910 at the edge of each data sector. For example, for the disk shown in FIG. 7, the grating would be comprised of concentric rings of material. A second grating 960 with period P2 is positioned adjacent to the disk. The two grating periods P1 and P2 are slightly different so that when viewed together they produce a moire, or spatial-interference, pattern. A linear photodiode array 970 is placed in close proximity to the second grating 960, and the two gratings and diode array are illuminated with a diode laser 940.

The diode array 970 detects the spatial-interference pattern produced by the two gratings. The phase of the spatial-interference pattern gives information about the relative position of the two gratings. Any distortions in the rotating disk 910 is detected as a phase shift in the spatial-interference pattern on the diode array. Accordingly, this position-error signal is fed back to the electron-beam unit 980 so that the e-beam can follow the data tracks 930. The method of locking the e-beam position to the center of the data track based upon the phase of a spatial-interference signal is known to those skilled in the art of electronic phase-locked loops.

In an alternative embodiment, the radially-periodic data tracks 930 themselves can be used instead of the patterned grating 950 on the rotating disk 910. Again, the radial periodicity of the data tracks, P1, must differ slightly from the period, P2, of the reference grating 960. This embodiment would obviate the need for a separate grating on the disk, and make available more space for data.

The technique of using gratings or data-tracking material at the edge of the data sectors can be used if the data tracks deviate uniformly, i.e., as a group of tracks. If path deviations differ from track to track, then the method embodied in FIG. 8 can be used to track the individual data path.

For the embodiment in which the data-tracking material is located at the edge of the data sector, the data within the sector need not be divided into separate tracks. Rather, the electron beam can be rapidly scanned laterally across the data sector, in a back-and-forth motion, as the disk 910 spins. In this manner, a swath of data would be read. This method would relax the requirement for following each individual data track precisely.

A method for patterning very-high-density data-storage media is described hereinafter. This method is referred to as deep-ultraviolet contact photolithography (DUVCP). DUVCP can be applied to other types of very-high-density data-storage devices, magnetic or optical, where the memory-bit size is very small. Other lithography techniques, known to those skilled in the art of lithography, can also be used to pattern the data. The advantage of DUVCP is that sub-100 nm size bits can be patterned over large areas rapidly, at low cost.

DUVCP requires the use of an optical mask, with a predefined pattern, which is brought into contact with the substrate to be patterned. The substrate is covered with a resist. After the mask and substrate are in contact, they are illuminated with deep-ultraviolet radiation that exposes the resist on the substrate in a pattern matching that on the optical mask. The process of contact photolithography is known to those skilled in the art of lithography.

Figure 10:
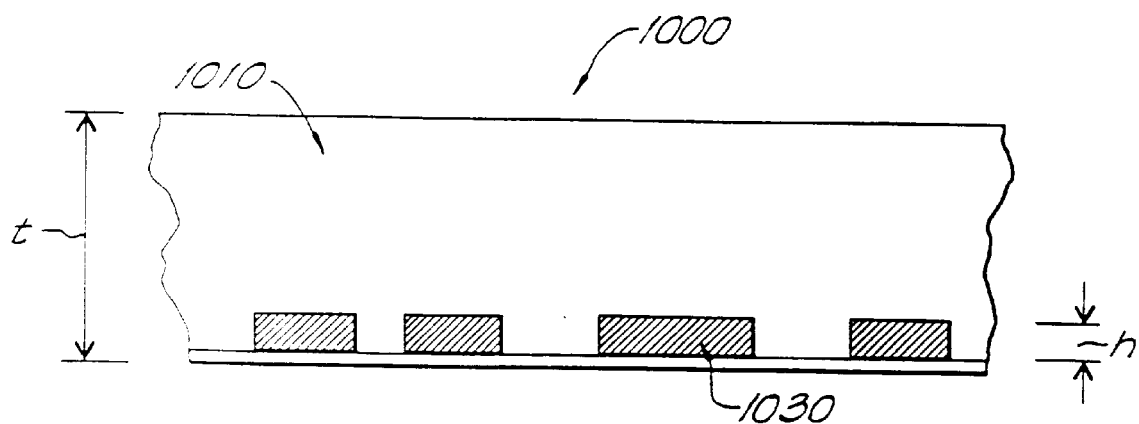
FIG. 10 is a cross-sectional view of a functional block diagram of an embedded attenuating-phase-shifting mask (EAPSM) for use with DUVCP in accordance with the invention.

FIG. 10 is a cross-sectional view of a functional block diagram of an embedded attenuating-phase-shifting mask (EAPSM) 1000 for use with DUVCP in accordance with the invention. The mask 1000 can be used to print sub-100 nm features of arbitrary shapes in circular or rectangular coordinates. The mask embodied in FIG. 10 consists of an ultraviolet-transparent substrate 1010, an attenuating and phase-shifting material 1030, and a thin protective layer or film 1050.

The attenuating and phase-shifting material defines the pattern to be printed on the substrate. For this mask 1000, the attenuating and phase-shifting material is embedded into the optically transparent substrate 1010. This can be done by etching and deposition processes known by those skilled in the art of lithography. Also, the thin (10 nm to 30 nm), optically transparent protective layer 1050 is deposited over the patterned phase-shifting attenuator. The protective layer should be hard and chemically resistant so that the mask can be aggressively cleaned, or it can consist of a low-interfacial-energy polymer film that easily releases any particles that might adhere to the mask. Materials such as sapphire ($Al_2O_3$), silicon nitride ($Si_3N_4$), silicon dioxide ($SiO_2$) and diamond can be used for this film.

The mask size can be large, i.e., 1 inch to 12 inches in diameter, and it can be mounted in a sturdy frame for ease of use. For DUVCP, the thickness of the mask, t, should be less than 500 $\mu$m so that it can conform to the substrate surface when in contact.

The height, h, and material properties of the attenuating phase-shifter are chosen such that two requirements are fulfilled. These criteria are: (1) the amplitude of the light passing through the material is reduced by 85% to 96%, and (2) the phase of the optical field which passes through the material is retarded by 180 degrees, or pi radians, relative to the phase of the field which travels the distance h in the transparent substrate.

When these criteria are met, the intensity pattern of the mask's image on the substrate is improved compared to a mask that only blocks or absorbs the impinging radiation. The EAPSM suppresses deleterious effects of diffraction and reduces the amplitude of intensity "side lobes" at the substrate. See B. J. Lin, Solid State Technology, January 1992, page 43, incorporated herein by reference.

Embedding the attenuating and phase-shifting material allows greater flexibility in mask design. For example, the deep-UV-transparent mask material can now be changed so that the phase-shift criteria (the second criteria listed above) can be met independently of the attenuation criteria (the first criteria). This permits the use of more materials as the attenuating phase shifter.

The protective layer 1050 on the mask 1000 reduces or eliminates damaging effects caused by particles, and permits easy cleaning of the mask for repeated use. In DUVCP, the mask 1000 is brought into contact with an underlying substrate. Particles on the mask or substrate could damage the mask's pattern, degrade the exposure or adhere to the mask. With the protective film 1050, the mask can be aggressively cleaned between exposures to remove any particles that might adhere to the mask. For example, a $CO_2$-snow cleaning procedure can be used to blow particles off the mask or substrate before the two are brought into contact. The mask can also be polished, and repolished, if necessary.

There is an additional advantage to having the pattern embedded in a transparent material with high refractive index. The high refractive index permits the patterning of finer features, and increases the process latitude in the fabrication of the mask. Normally, when the opening in an opaque material is smaller than half the wavelength of light, the optical field decays exponentially as it propagates along the opening. Thus, the optical intensity, or exposure dose, beyond the mask would be exponentially sensitive to the thickness of the absorbing material. Because of the substrate's high refractive index, n, in these mask designs, the effective wavelength of light is reduced according to $\lambda_{eff} = \lambda/n$. Thus, the radiation can propagate through the openings in the mask without exponential decay.

There exists an exemplary application for the use of the EAPSM described heretofore. In this application, the mask is used to pattern periodic structures such as gratings, or grids. These may be patterned in rectangular geometry, i.e., X-Y coordinates, or polar geometry, R-θ coordinates. Such periodic structures might be useful as data tracks or data-tracking structures on circular disks or rectangular disks used in very-high-density magnetic, optical, or scintillating data-storage devices. The mask might also be useful for patterning photodiode arrays or transistor arrays used in imaging devices, or for patterning light-emitting arrays used in flat-panel displays.

For this application, the criteria (1) and (2), stated heretofore, need not be strictly satisfied. For example, the embedded material 1030 in FIG. 10 can be completely opaque, i.e., it absorbs or reflects all of the incident radiation. Alternatively, the phase criteria (2) can be met and the material can be transparent to the incident radiation. When used to pattern polar geometry, the incident optical radiation should be unpolarized or circularly polarized.

For both of these examples of the exemplary application, the EAPSM acts as a diffraction grating. The incident radiation is diffracted by the mask into multiple orders. In this case, a periodic intensity modulation, which results from the interference of the diffracted orders, will be present in the transmitted optical field. For some spatial periods and well-collimated incident radiation, the periodic intensity modulation will extend far beyond the mask, so that the mask need not be brought into intimate contact with the substrate to be patterned. This is similar to the technique called near-field holography as described by Tennant et al., J. Vac. Sci. Technol. B, Vol. 10, No. 6, 2530 (1992), incorporated herein by reference.

Figure 11:
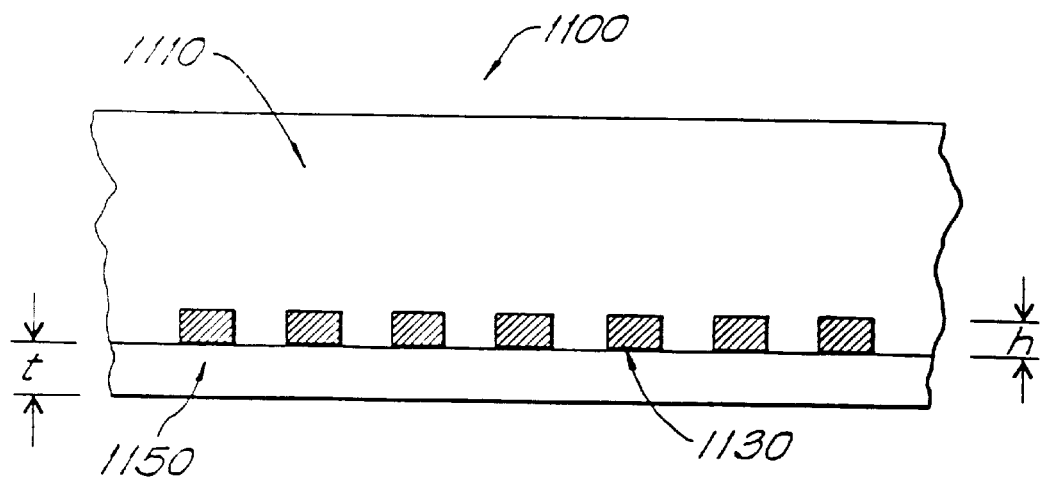
FIG. 11 a cross-sectional view of a functional block diagram of an embedded phase shifting mask for use with DUVCP in accordance with the invention.

FIG. 11 is a cross-sectional view of a functional block diagram of an embedded phase shifting mask 1100 for use with DUVCP in accordance with the invention. A periodic pattern grating) 1130 of an optically transparent material is embedded in a transparent substrate 1110. A protective layer 1150 is coated over the pattern. In this case, the thickness, t, of the protective layer is adjusted so that $$t \approx nP^2/(2\lambda)$$

where n is the refractive index of the transparent protective layer, P is the spatial period of the grating pattern 1130, and λ is the wavelength of the incident radiation used in the exposure.

If this requirement is met, the spatial period of the intensity pattern on the substrate will be one-half of the period P according to the Talbot effect. See U.S. Pat. No. 4,360,586 issued to Flanders et al., and Chapman et al., Phys. Rev. A, Vol. 51, p. R14 (1955), both of which are incorporated herein by reference. In this case, the Talbot effect has been modified by the refractive index n. The protective layer also serves to maintain a constant distance between the pattern and the substrate, which is desirable for exposing large areas uniformly. Other sub-multiples of the spatial period P may be obtained by carefully adjusting the thickness, t, if diffraction orders greater than 1 are transmitted by the mask. For a mask substrate 1110 and protective layer 1150 of sapphire (n≈1.9), and an incident radiation of 193 nm from an ArF laser, it would be possible to print periodic structures with a spatial period of about 60 nm using this mask.

When the EAPSM's are used for patterning other substrates such as silicon wafers, a bi-level resist process (see Schattenburg et al., Opt. Eng., Vol. 30, p. 1950 (1991)), a tri-level resist process (see Schattenburg et al., J. Vac. Sci. and Technol. B, Vol. 13, p. 3007 (1995)), or a top-surface imaging resist process (see Hartney et al., J. Vac. Sci. and Technol B, Vol. 8, p. 1476 (1990)) can be used on the substrate to be patterned. All of the aforementioned articles are incorporated herein by reference.

There are several methods for patterning the EAPSM's described heretofore. The mask-patterning process can utilize electron-beam lithography or ion-beam lithography for arbitrary patterns. For periodic patterns in rectangular geometry, interferometric lithography can be used (see Schattenburg et al., J. Vac. Sci. and Technol. B, Vol. 13, p. 3007 (1995)). A technique for patterning radially-periodic structures, i.e., concentric rings, over large areas will now be described.

Figure 12A:
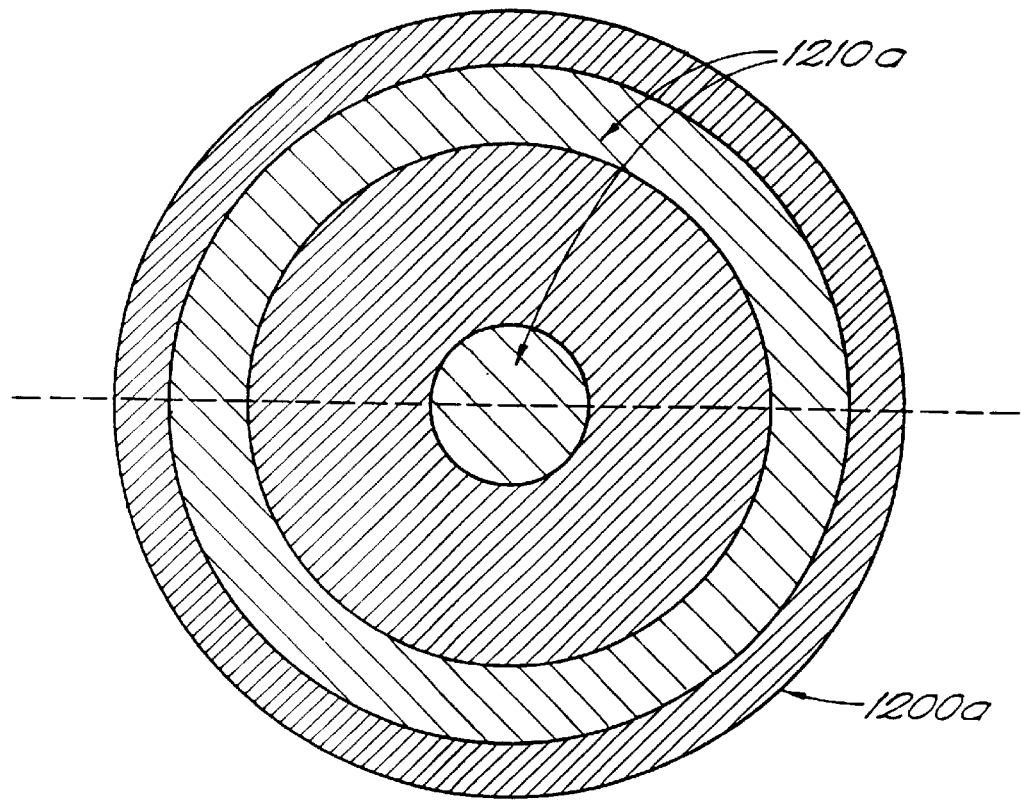
FIGS. 12A and 12B are a top view and a cross-sectional view, respectively, of an exemplary embodiment of reflective-optical components configured for creating a radially-periodic interference pattern.
Figure 12B:
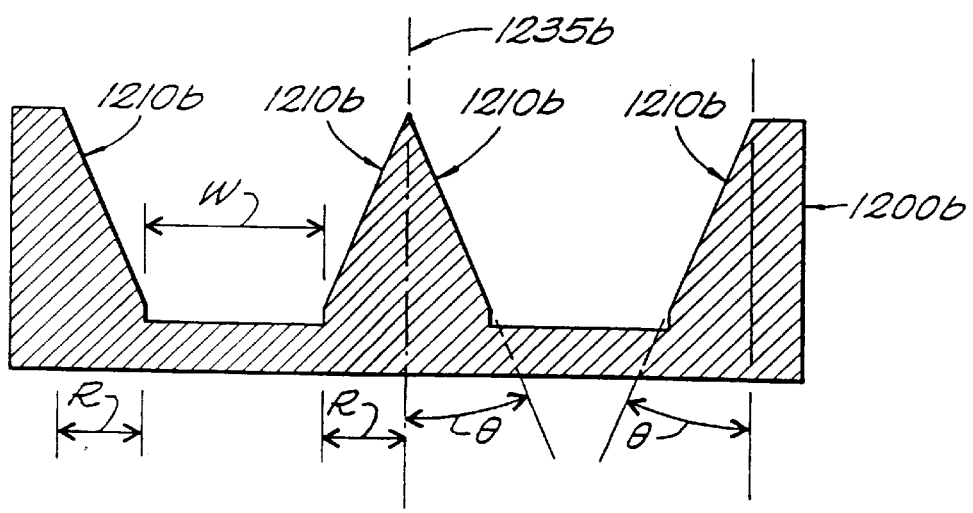

A method of patterning radially-periodic structures is exemplified in FIGS. 12A and 12B. This method employs interferometric lithography to produce a radially-periodic interference pattern. Several optical components are required in this exemplary embodiment. This method can be used to pattern data tracks or data-track outriggers on very-high-density magnetic, near-field optical or scintillating data-storage media.

FIGS. 12A and 12B are a top view and a cross-sectional view, respectively, of an exemplary embodiment of reflective-optical components 1200a and 1200b configured for creating a radially-periodic interference pattern. The fabrication of such optical components is known to those skilled in the art of fabricating axicon optical components. The optical components can be fabricated from a solid piece of metal or glass. The optical components have reflective conically shaped surfaces 1210a and 1210b that make an angle θ with respect to an optical axis 1235b. The optical quality of the reflective surfaces must be very good so as not to introduce excessive phase-front distortions in the incident optical wave (not shown). A recessed flat region of width W extends from the inner reflective surface to the outer reflective surface, and is used to hold a substrate during the interferometric exposure. The width of the conically shaped reflective surfaces is R as shown in FIG. 12B.

Figure 12C:
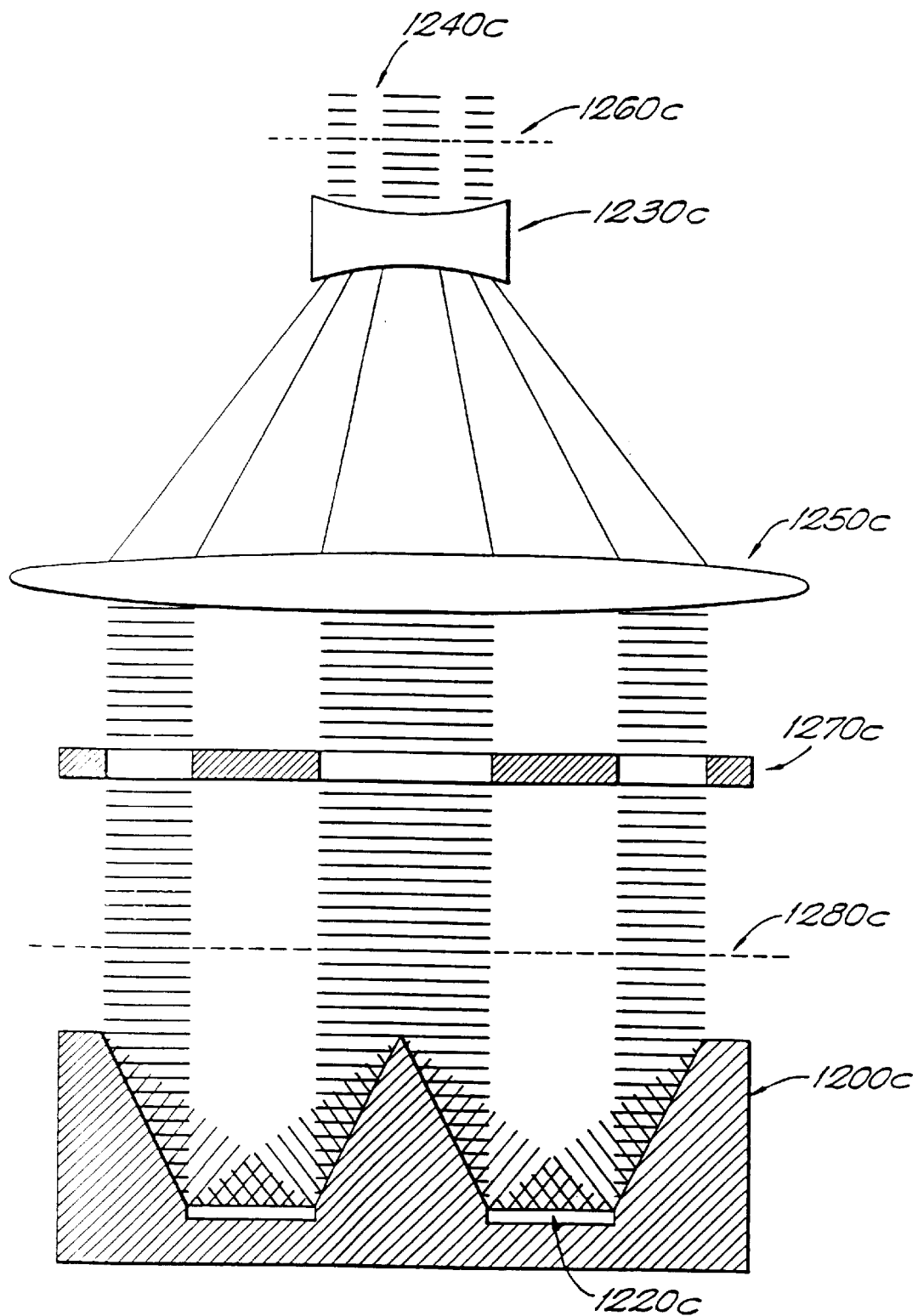
FIG. 12C is a functional block diagram of the use of an axicon reflective-optical component for patterning radially-periodic structures on a substrate.
Figure 12D:
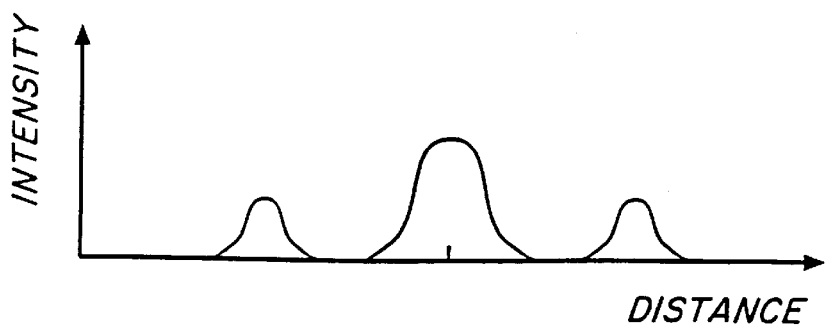
FIGS. 12D and 12E are intensity profiles of an optical beam used in patterning radially-periodic structures on a substrate.
Figure 12E:
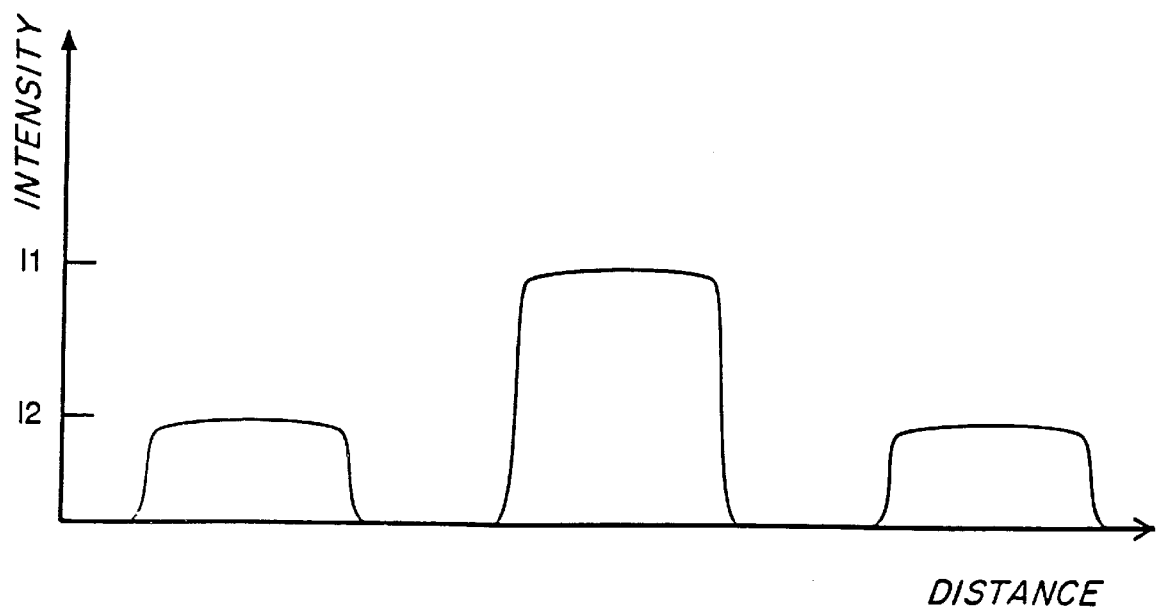

FIG. 12C is a functional block diagram of the use of an axicon reflective-optical component 1200c in accordance with the invention. FIG. 12C shows an exemplary embodiment of the use of radially-periodic interferometric exposure. A substrate 1220c in the shape of an annulus is located at the base of the axicon optical component 1200c. Three other quality optical components (1230c, 1250c and 1270c) are used in the interferometric exposure. Additionally, an incident laser beam 1240c from a conventional laser source (not shown) has been prepared in a higher-order Gaussian mode, so that its intensity profile at the location marked 1260c is as shown in FIG. 12D. The incident laser beam is then expanded and collimated by a lens pair 1230c and 1250c, and sent through a beam apodizer 1270c. The beam apodizer reshapes the intensity profile by selective attenuation so that it appears as shown in the graph of FIG. 12E. As an example, the intensity profile can be flat-topped for the inner beam and outer annulus. The reshaped beam is then incident on the axicon optical component as shown in FIG. 12C. A radially periodic intensity pattern is produced by the interference between the inner beam and outer annulus as shown.

It will be appreciated that a higher-order Gaussian beam profile is not strictly necessary for this application. A simple Gaussian-shaped laser beam can be used and the apodizer can be constructed to block the unwanted portions of the beam. This would result in a loss of optical power.

With reference to FIG. 12B, the spatial period P of the radial interference pattern is given as $$P=\lambda/[2\cos(2\theta)]$$

where $\lambda$ is the optical wavelength of the laser beam. The width W of the exposed region is given by $$W=R/[\cos(2\theta)]$$

where W and R are defined with reference to FIG. 12B. These two equations indicate that a desired pitch P is achieved by choosing $\theta$, and a desired exposure area is achieved by choosing R.

For a high-contrast radial-interference pattern, the intensity of the inner beam, I1, and outer beam, I2, must be adjusted appropriately. See FIG. 12E. The contrast of the interference pattern will be highest when the ratio I1/I2 is given by $$I1/I2=3+2/\cos(2\theta)$$

where $\theta$ is shown in FIG. 12B. Alternatively, the total power in the outer beam must equal the total power in the inner beam.

To avoid polarization effects in the radially periodic interferometric exposure, the laser beam can be made circularly polarized or unpolarized. Chromatic effects can be minimized by careful design of the expanding and collimating lens pair 1230c and 1250c of FIG. 12C. These techniques are known to those skilled in the art of optics. To minimize back-reflections from the substrate 1220c, a bi-layer or tri-layer resist structure can be used in conjunction with this exposure scheme.

There are desirable attributes of the radial-interferometric exposure configuration shown in FIG. 12C. The configuration can be made compact. The distance from the first lens, 1230c, to the axicon optic component, 1200c, can be less than 18 inches depending on the size of the substrate. Additionally, phase stabilization of the interfering beams should not be required since both beams travel along essentially the same path. Also, the beam combining mirrors on the axicon optic component are stable with respect to each other since they are fabricated on the same piece of material. Air turbulence in the optical beam path should be minimized since it may affect the interference pattern.

Figure 13A:
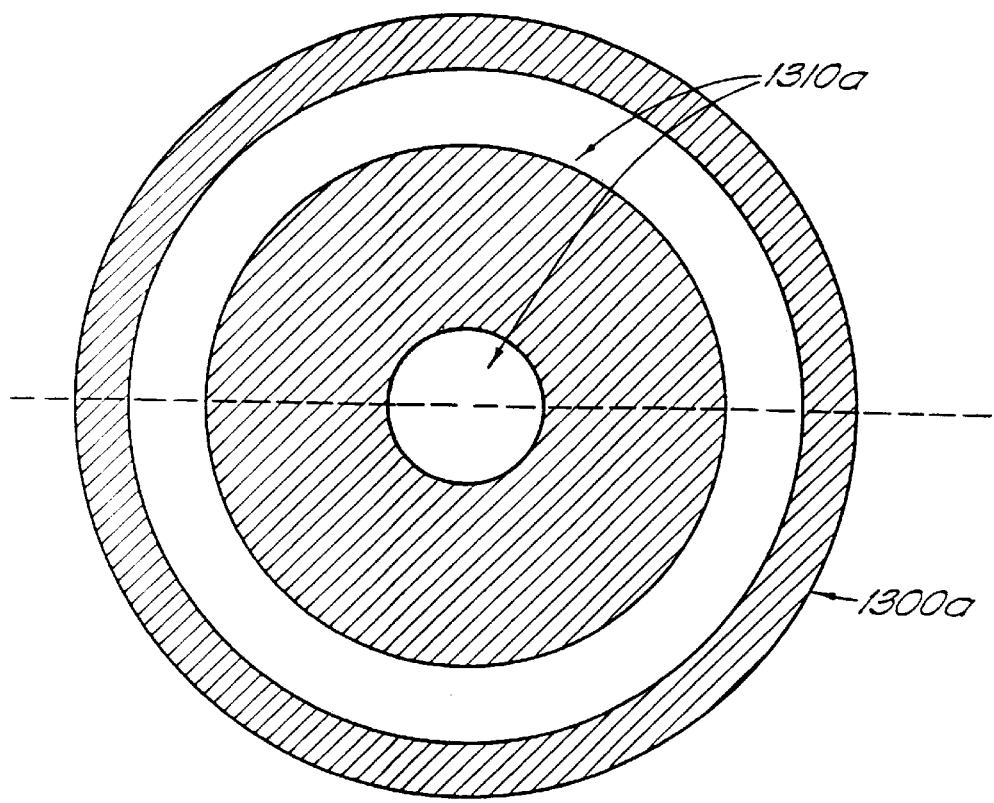
FIGS. 13A and 13B are top and cross-sectional views of exemplary axicon transmissive-optical components, which can be used to pattern radially-periodic structures.
Figure 13B:
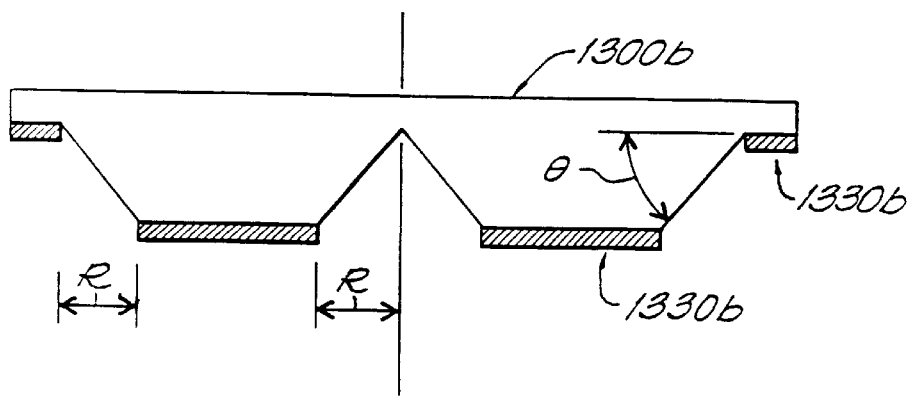

FIGS. 13A and 13B are top and cross-sectional views of exemplary axicon transmissive-optical components 1300a and 1300b, which can be used to pattern radially periodic structures. The components also have apodizing elements 1330b incorporated directly onto its surface. A laser beam passes through the clear areas 1310a and recombines beyond the optical component to produce a radial interference pattern of pitch P in an annulus of width W. For this optic, $$P=\lambda/[sin(sin^{-1}(n\sin\theta)-\theta)]$$

where $\theta$ is shown in FIG. 13B, and $$W=R\cos[\sin^{-1}(n\sin\theta)]/[\cos\theta\cos(\sin^{-1}(n\sin\theta)-\theta)]$$

where R is shown in FIG. 13B. This component can be used in place of the apodizer and axicon reflective-optical component shown in FIG. 12C.

When used to pattern radially periodic structures for the proposed very-high-density optical-data storage device, the quality of the optical components in FIG. 12C need not be extremely high. Low spatial-frequency surface distortions will cause deviations in the concentric ring pattern, but these deviations can be tracked as described herein.

Although the present invention has been shown and described with respect to several preferred embodiments thereof, various changes, omissions and additions to the form and detail thereof, may be made therein, without departing from the spirit and scope of the invention.

What is claimed is:

1. A data-storage medium comprising:
    a scintillating substrate that emits photons in response to impinging particles such as electrons or ions; and
    a particle blocking layer provided on a surface of said substrate and including a pattern of small vias that expose portions of said substrate, said pattern corresponding to predetermined stored data which is readable by detecting said photons emitted from said scintillating substrate in accordance with said pattern and in response to surface impingement by electrons or ions.

2. The data-storage medium in accordance with claim 1, wherein said medium comprises a disk that spins.

3. The data-storage medium in accordance with claim 1, wherein said medium comprises a cylinder that rotates.

4. The data-storage medium in accordance with claim 1, wherein said medium comprises a rectangular sheet that moves along X-Y axes.

5. The data-storage medium in accordance with claim 1, wherein said blocking layer comprises a scintillator that emits photons with wavelengths substantially different from said photons emitted from said scintillating substrate in said data-storage medium.

6. The data-storage medium in accordance with claim 1, wherein said blocking layer comprises a metal which produces a large number of backscattered or secondary electrons in response to impingement by electrons or ions.

7. A data-storage medium in accordance with claim 2, wherein said blocking layer comprises a pattern of radially periodic structures.

8. A data-storage medium in accordance with claim 3, wherein said blocking layer comprises a pattern of linearly periodic structures.

9. A memory device comprising:
    a scintillating substrate that emits photons in response to impinging electrons or ions, said substrate including a particle blocking layer provided on a surface of said substrate, said layer including a pattern of small vias that expose portions of the surface of said substrate;
    a source comprising a compact electron-optical column adapted to impinge said substrate's surface with electrons, ions or high-energy photons through said pattern of vias so that said substrate emits photons in accordance with said pattern of small vias, the emitted photons corresponding to predetermined data; and
    a detection unit adapted to detect emitted photons or electrons from said scintillating substrate.

10. A memory device in accordance with claim 9, wherein said source comprises multiple independent, compact electron- or ion-beam columns.

11. A memory device in accordance with claim 9, wherein said compact electron-optical column deflects the electron or ion beam in one direction only.

12. A method of writing data in a scintillating substrate comprising:

generating a beam of electrons, ions or photons to impinge a surface of said substrate; and increasing the flux of said beam, at intervals corresponding to predetermined data, so that the scintillating substrate is chemically or physically altered locally to no longer emit photons in response to impinging particles such as electrons or ions.

* * * * *